(12) United States Patent
Ruelke et al.

(10) Patent No.: US 6,927,161 B2
(45) Date of Patent: Aug. 9, 2005

(54) LOW-K DIELECTRIC LAYER STACK INCLUDING AN ETCH INDICATOR LAYER FOR USE IN THE DUAL DAMASCENE TECHNIQUE

(75) Inventors: Hartmut Ruelke, Dresden (DE); Christof Streck, Coswig (DE); Georg Sulzer, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/420,214

(22) Filed: Apr. 22, 2003

(65) Prior Publication Data
US 2004/0041239 A1 Mar. 4, 2004

(30) Foreign Application Priority Data
Aug. 30, 2002 (DE) .......................... 102 40 176

(51) Int. Cl.⁷ .......................................... H01L 21/4763
(52) U.S. Cl. .................. 438/637; 438/634; 438/740
(58) Field of Search ............................ 438/634, 637, 438/730, 740; 257/E21.579, E21.528

(56) References Cited

U.S. PATENT DOCUMENTS

| | | | | |
|---|---|---|---|---|
| 6,037,664 A | | 3/2000 | Zhao et al. ................. | 257/758 |
| 6,153,511 A | * | 11/2000 | Watatani ..................... | 438/623 |
| 6,238,937 B1 | * | 5/2001 | Toprac et al. ................ | 438/9 |
| 6,511,920 B2 | * | 1/2003 | Nguyen et al. .............. | 438/763 |
| 6,514,856 B2 | * | 2/2003 | Matsumoto ................. | 438/637 |
| 6,548,400 B2 | * | 4/2003 | Brennan et al. ............ | 438/637 |
| 6,593,655 B1 | * | 7/2003 | Loboda et al. .............. | 257/760 |
| 6,624,061 B2 | * | 9/2003 | Aoki .......................... | 438/622 |

FOREIGN PATENT DOCUMENTS

| | | | |
|---|---|---|---|
| DE | 19814703 A1 | 1/1999 | ......... H01L/21/768 |
| WO | WO 00/19523 | 4/2000 | ......... H01L/21/768 |

OTHER PUBLICATIONS

Wolf and Tauber; Silicon Processing for the VLSI Era vol. 1: Process Technology; pp. 73, 168, 183, 184, 198; Lattice Press 1986, Sunset Beach, CA.*

Wolf, Stanley; Silicon Processing for the VLSI Era vol. 2: Process Integration; p. 194; Lattice Press 1990, Sunset Beach CA.*

Miyamoto et al., "High–Speed and Low–Power Interconnect Technology for Sub–Quarter–Micron ASIC's," *IEEE Transactions on Electron Devices*, 44:250–56, 1997.

* cited by examiner

Primary Examiner—George Fourson
Assistant Examiner—Fernando L. Toledo
(74) Attorney, Agent, or Firm—Williams, Morgan & Amerson, P.C.

(57) ABSTRACT

A low-k dielectric layer stack is provided including a silicon based dielectric material with a low permittivity, wherein an intermediate silicon oxide based etch indicator layer is arranged at a depth that represents the depth of a trench to be formed in the dielectric layer stack. A thickness of the etch indicator layer is sufficiently small to not unduly compromise the overall permittivity of the dielectric layer stack. On the other hand, the etch indicator layer provides a prominent optical emission spectrum to reliably determine the time point when the etch process has reached the etch indicator layer. Thus, the depth of trenches in highly sophisticated low-k dielectric layer stacks may reliably be adjusted to minimize resistance variations of the metal lines.

29 Claims, 3 Drawing Sheets

LOW-K DIELECTRIC LAYER STACK INCLUDING AN ETCH INDICATOR LAYER FOR USE IN THE DUAL DAMASCENE TECHNIQUE

BACKGROUND OF THE INVENTION

1. Field of the Invention

Generally, the present invention relates to the formation of integrated circuits, and, more particularly, to the formation of metallization layers including a dielectric having a low permittivity to enhance device performance.

2. Description of the Related Art

In modern integrated circuits, minimum feature sizes, such as the channel length of field effect transistors, have reached the deep submicron range, thereby steadily increasing performance of these circuits in terms of speed and power consumption. As the size of the individual circuit elements is significantly reduced, thereby improving, for example, the switching speed of transistor elements, the available floor space for interconnect lines electrically connecting the individual circuit elements is also decreased. Consequently, the dimensions of these interconnect lines have to be reduced to compensate for a reduced amount of available floor space and for an increased number of circuit elements provided per chip. In integrated circuits having minimum dimensions of approximately 0.35 µm and less, a limiting factor of device performance is the signal propagation delay caused by the switching speed of the involved transistor elements. As the channel length of these elements has now reached 0.18 µm and less, it turns out, however, that the signal propagation delay is no longer limited by the field effect transistors but is limited, owing to the increased circuit density, by the close proximity of the interconnect lines, since the line-to-line capacitance is increased in combination with a reduced conductivity of the lines due to a reduced cross-sectional area. The parasitic RC time constants therefore require the introduction of a new type of dielectric material, preferably in combination with a highly conductive metal.

Traditionally, metallization layers are formed by a dielectric layer stack including, for example, silicon dioxide and/or silicon nitride, with aluminum as the typical metal. Since aluminum exhibits significant electromigration at higher current densities, in highly sophisticated integrated circuits, aluminum is commonly replaced by copper having a significantly lower electrical resistance and a higher resistivity against electromigration. Moreover, the well-established and well-known dielectric materials silicon dioxide (k≈4.2) and silicon nitride (k>5) are increasingly replaced by low-k materials to reduce parasitic capacitances. However, the transition from the well-known and well-established aluminum/silicon dioxide metallization layer to a low-k dielectric/copper metallization layer is associated with a plurality of issues to be dealt with.

For example, copper may not be deposited in higher amounts in an efficient manner by well-established deposition methods, such as chemical and physical vapor deposition. Moreover, copper may not be efficiently patterned by well-established anisotropic etch processes so that, consequently, the so-called damascene technique is employed in forming metallization layers including copper lines. Typically, in the damascene technique, the dielectric layer is deposited and then patterned with trenches and vias that are subsequently filled with copper by plating methods, such as electroplating or electroless plating. For forming vias providing electrical connection from an overlying copper line to an underlying copper line of a lower metallization layer, the vias and the trenches may be filled in a single process so that the vias and trenches have to be patterned prior to filling in the copper. A corresponding technique, also referred to as a dual damascene technique, is carried out for a conventional dielectric layer stack by providing a silicon dioxide layer and an intermediate silicon nitride layer that acts as an etch stop layer for the trench etch and a second silicon dioxide layer formed thereon. Subsequently, a via may be etched in the upper silicon dioxide layer and the silicon nitride layer may be opened for a subsequent via etch, wherein prior to etching the via into the lower silicon dioxide layer a respective photoresist mask for the trench etching of the upper silicon dioxide layer is formed. Then, the trench etch and the lower via etch may be performed simultaneously, wherein the depth of the trench is reliably controlled by the silicon nitride etch stop layer. When replacing the high-k material silicon dioxide by a low-k material, the situation in forming the via and trench is quite different, as the provision of an intermediate etch stop layer, such as the silicon nitride layer exhibiting a high k value, may unduly increase the permittivity of the entire dielectric stack. To obtain a minimum permittivity, the intermediate etch stop layer is commonly omitted. A frequently used etch scheme for forming trenches and vias may be performed according to the sequence as will now be described with reference to FIGS. 1a–1d.

Figure 1A:
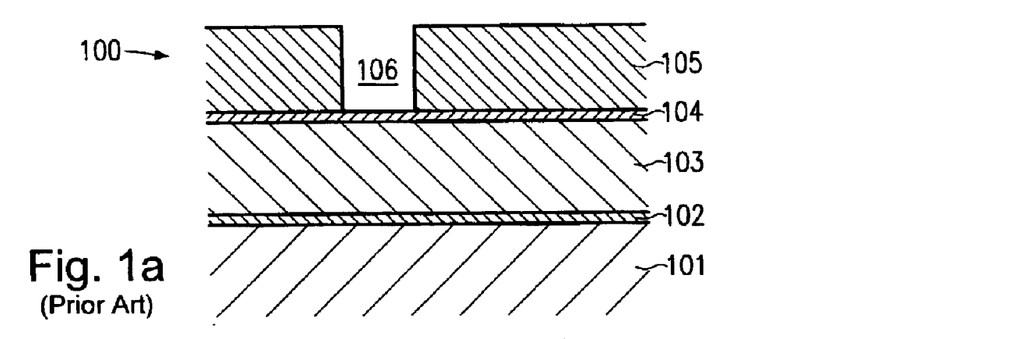
FIGS. 1a–1d schematically show cross-sectional views of a dual damascene process sequence according to a typical conventional process flow.

FIG. 1a schematically shows a cross-sectional view of a semiconductor structure 100 including a substrate 101 that may include circuit elements, such as transistors, capacitors, resistors and the like and may include one or more metallization layers similar to a metallization layer to be formed on the substrate 101. A bottom etch stop layer 102 that also serves as a diffusion barrier is formed on the substrate 101 with a thickness sufficient to reliably stop or slow down an etch process to avoid damage of the underlying substrate 101 and to substantially prevent diffusion of a metal, such as copper, into underlying materials. In highly sophisticated applications, it is preferred that the etch stop layer 102 is provided as a low-k material that replaces, for example, a silicon nitride layer. For instance, a silicon carbide nitride (SiCN) layer may be used as the etch stop layer 102, which is also referred to as "barrier low-k" (BLOK). A low-k dielectric layer 103 is formed on the etch stop layer 102. One viable candidate for a low-k material for the dielectric layer 103 is hydrogen-containing silicon-oxy-carbide (SiCOH) having a permittivity of approximately 2. In some applications, an anti-reflective coating 104 formed on the dielectric layer 103 may be necessary for patterning the dielectric layer 103. Finally, a patterned photoresist mask 105 is formed over the dielectric layer 103, with an opening 106 formed therein, that represents the dimensions of the via to be formed in the dielectric layer 103. The process techniques required for forming the semiconductor structure 100 shown in FIG. 1a are well established and well known and thus a description thereof will be omitted.

Figure 1B:
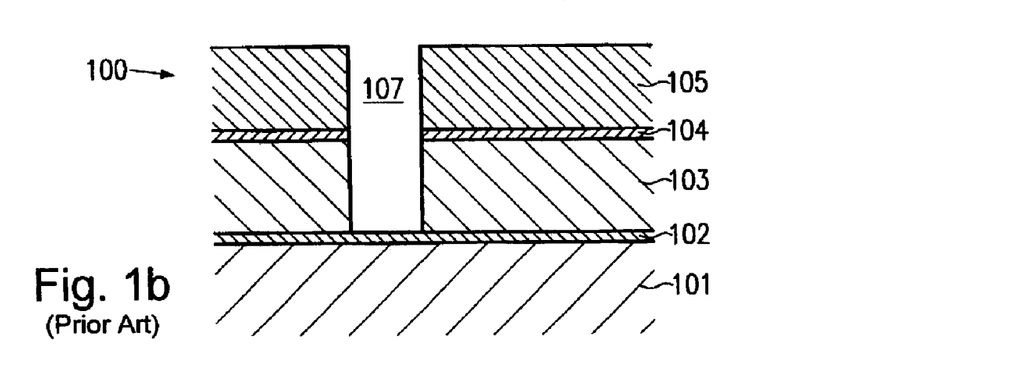

Subsequently, an anisotropic etch process is carried out, wherein the photoresist mask 105 acts as an etch mask. FIG. 1b schematically shows the semiconductor structure 100 after completion of the anisotropic etch process. A via 107 is formed in the dielectric layer 103 in accordance with the dimensions of the opening 106 (FIG. 1a).

Figure 1C:
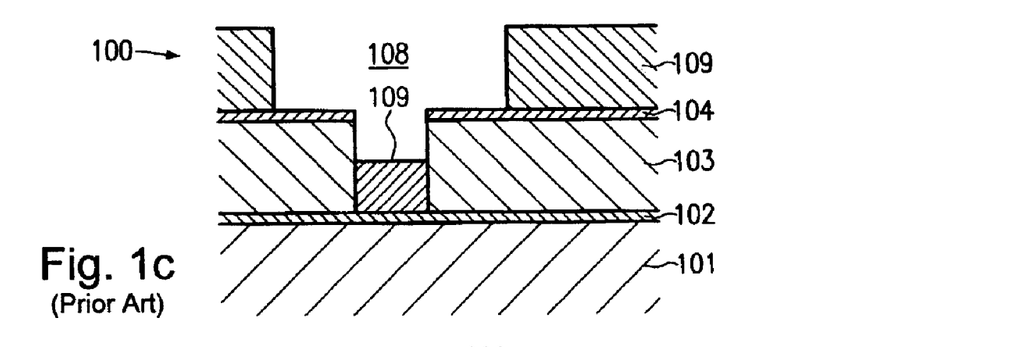

FIG. 1c schematically depicts the semiconductor structure 100 with a photoresist mask 109 having an opening 108 in conformity with the design dimensions of a trench to be formed. Optionally, the resist mask 109 may be designed such that the bottom of the opening 107 is also covered. Subsequently, the substrate 101 is anisotropically etched, wherein process parameters, especially the process time, have to be precisely controlled to obtain a required depth for the trench to be formed.

Figure 1D:
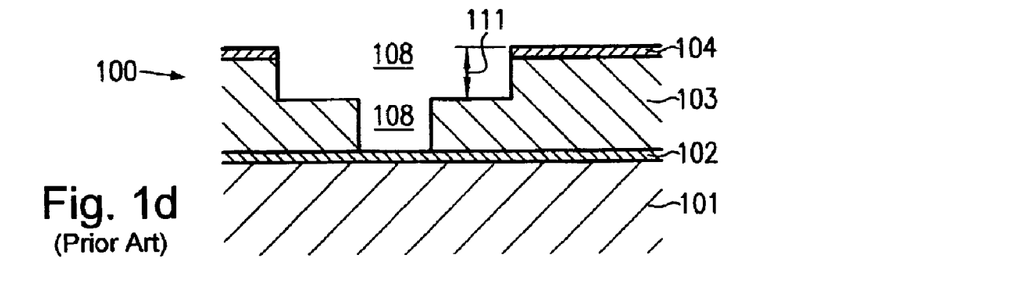

FIG. 1d schematically shows the semiconductor structure 100 after completion of the anisotropic etch process with a trench 110 formed in an upper portion of the dielectric layer 103. A depth 111 of the trench 110 is thus determined by the etch process parameters. It thus appears that although a simple and effective process sequence may be established by providing the dielectric layer 103 without an intermediate etch stop, thereby resulting in an optimum low-k value, any variations of the anisotropic etch process may result in a depth variation and may, therefore, entail a variation of the electric performance of a copper line formed in the trench 110, as the resistance thereof depends on the cross-section of the trench 110.

Since a copper line resistance variation may have an adverse impact on the device performance, it would therefore be highly desirable to provide for a dual damascene scheme that allows an optimum low-k value for a given dielectric material without being prone to significant trench depth variations.

The present invention is directed to overcoming, or at least reducing the effects of, one or more of the problems set forth above.

SUMMARY OF THE INVENTION

Generally, the present invention is directed to a dual damascene scheme including a dielectric layer stack having a bottom etch stop layer and first and second low-k dielectric layers separated by a very thin etch indicator layer that allows the determination of an end of the trench etch more precisely than in the conventional processing so that trench depth variations may significantly be reduced, wherein the ultra-thin indicator layer does not substantially affect the overall permittivity of the low-k dielectric stack.

According to one illustrative embodiment of the present invention, a semiconductor structure includes a low-k dielectric layer stack. The dielectric layer stack comprises a barrier layer, a first dielectric layer including a hydrogen-containing silicon-oxy-carbide (SiCOH) material and a second dielectric layer including a hydrogen-containing silicon-oxy-carbide (SiCOH) material. Moreover the dielectric layer stack comprises an etch indicator layer disposed between the first and second dielectric layers.

According to another illustrative embodiment of the present invention, a semiconductor structure includes a low-k dielectric layer stack that comprises a barrier layer and a first dielectric layer located on the barrier layer and a second dielectric layer. A silicon dioxide based etch indicator layer is disposed between the first and second dielectric layers.

According to yet another illustrative embodiment of the present invention, a method of forming a low-k dielectric layer stack comprises providing a substrate having formed thereon a barrier layer. A first dielectric layer is formed on the barrier layer and subsequently a silicon dioxide based etch indicator layer is formed on the first dielectric layer. Finally, a second dielectric layer is formed on top of the etch indicator layer.

According to yet a further illustrative embodiment of the present invention, a method of forming a metallization structure of a semiconductor device comprises providing a substrate having formed thereabove a low-k dielectric layer stack including a barrier layer, a first and a second dielectric layer and a silicon oxide based etch indicator layer disposed between first and second dielectric layers. A via is formed in the dielectric layer stack and a trench is etched around the via, while an optical emission spectrum of at least one of cyanide (CN) and a carbon monoxide (CO) compound is observed. Additionally, the etching is discontinued on the basis of information extracted from the optical emission spectrum.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As previously noted, the present invention is based on the finding that the provision of an intermediate etch indicator layer, i.e., a layer that provides a prominent output signal that may be detected by an optical detection system, may allow a precise determination of the end of the etch sequence. Thus, according to the present invention, the thickness of the etch indicator layer is thin enough to not unduly increase the permittivity of the low-k dielectric layer, yet provides a reliable output signal to clearly identify the end of the etch process, while a high degree of compatibility with standard processes is achieved.

Figure 2:
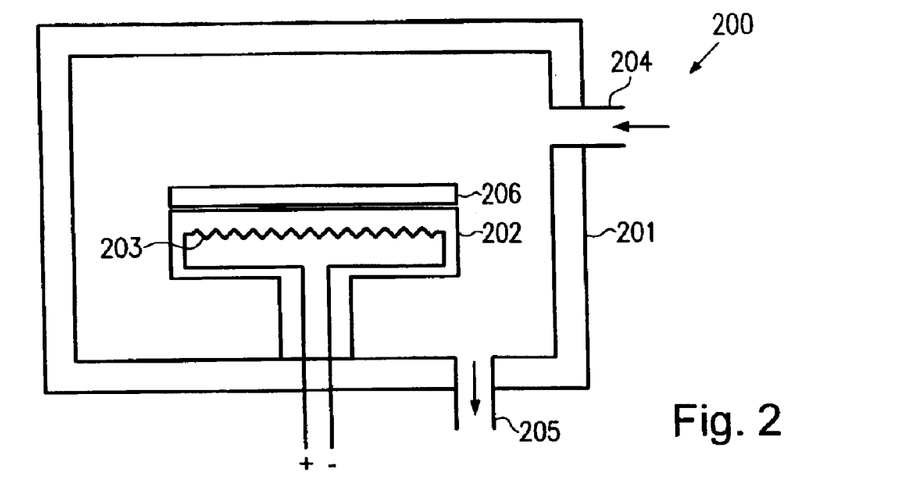
FIG. 2 schematically shows a typical deposition tool appropriate for carrying out the deposition sequence according to illustrative embodiments of the present invention.

In FIG. 2, a typical deposition tool 200 is shown in a schematic and very simplified manner. The deposition tool 200 includes a process chamber 201 including a substrate holder 202 with a heating means 203 incorporated therein. Moreover, a feed gas inlet 204 and a gas outlet 205 are provided, wherein it is to be appreciated that the inlet 204 and the outlet 205 are connected to appropriate precursor sources (not shown) and pump sources (not shown) to provide the required precursor gases within the process chamber 201 with a desired flow rate and to establish a required negative pressure. Moreover, for plasma-enhanced chemical vapor deposition, appropriate means for exciting and maintaining a plasma over the substrate holder 202 may be provided. For the sake of simplicity, the corresponding means are not shown in FIG. 2. In one illustrative embodiment, the deposition tool 200 may be plasma-enhanced CVD systems from Applied Materials available under the names of DXZ™ and Producer™, respectively.

Figure 3:
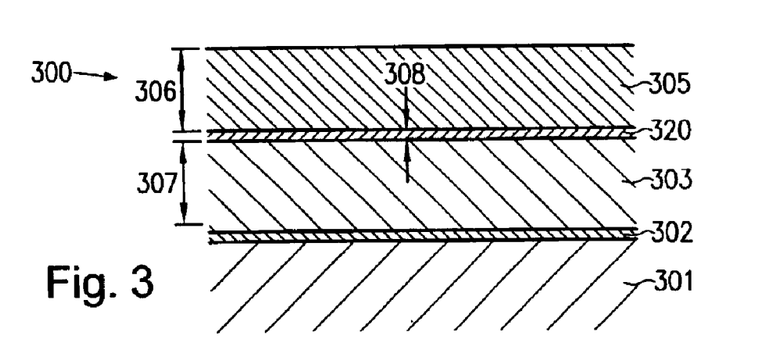
FIG. 3 schematically shows a cross-sectional view of a semiconductor structure including a low-k dielectric layer stack according to one illustrative embodiment of the present invention.

The operation of the deposition tool 200 will be described below with reference to FIG. 3, schematically depicting a semiconductor structure including a dielectric layer stack in accordance with one illustrative embodiment of the present invention.

In FIG. 3, a semiconductor structure 300 includes a substrate 301, which may have formed thereon and therein circuit elements such as transistors, capacitors, resistors and the like, as well as one or more metallization layers. An etch stop layer 302 that may also serve as a barrier layer is formed above the substrate 301 and is comprised of a material that exhibits a high etch selectivity to a material of a first dielectric layer 303 formed on the etch stop layer 302. Moreover, the etch stop layer 302 may preferably have high barrier qualities for preventing diffusion of a metal, such as copper, into underlying material layers. It should be understood that the substrate 301 is intended to be representative of any structure above which the dielectric stack may be formed. As will be understood by those skilled in the art, the present invention may be employed at any level of an integrated circuit device. Thus, it may be employed when manufacturing conductive interconnects that will actually contact the semiconductor devices formed in the semiconducting substrate, or in forming conductive interconnects at any level of a multi-level structure for the conductive lines and vias of an integrated circuit device. In one particular embodiment, the etch stop layer 302 comprises silicon carbide nitride (SiCN) exhibiting a relatively low-k value. A second dielectric layer 305 is formed over the first dielectric layer 303 with an etch indicator layer 320 disposed in between. The first and second dielectric layers 303, 305 may be formed of the same or of different low-k materials and, in one particular embodiment, substantially comprise hydrogen-containing silicon-oxy-carbide (SiCOH) having a permittivity in the range of approximately 2.8–3.1. Other materials may be used, such as porous SiCOH, BD2™, BD3™ produced according to process techniques from Applied Materials, DEMS™, OMCCS™, Tomcat™ produced according to process techniques from Dow Corning, and the like. In spin-on schemes for applying the first and/or the second dielectric layer 303, 305, SiLK, porous SiLK, MSQ, HSQ, MesoELK2.2™, MesoELK1.9™ and the like may be used.

The first and second dielectric layers 303, 305 are provided with a first thickness 307 and a second thickness 306, respectively, such that the total thickness corresponds to the design requirements. In particular, the second thickness 306 is selected so as to correspond to a desired depth of a trench to be formed in the second dielectric layer 305. In typical embodiments, the second thickness 306 is in the range of approximately 200–300 nm. The first thickness 307 is typically selected within a range of approximately 200–300 nm. A thickness 308 of the etch indicator layer 320 is selected to provide a sufficient monitor signal, as will be explained later, while still not unduly increasing the overall permittivity of the dielectric layer stack comprised of the first and second dielectric layers 303, 305 and the etch indicator layer 320. In one embodiment, the etch indicator layer 320 comprises silicon dioxide and the thickness is in the range of approximately 5–35 nm.

In the following, the operation of the deposition tool 200 will be described with reference to the formation of a low-k dielectric layer substantially comprised of hydrogen-containing silicon-oxy-carbide (SiCOH). It should be appreciated, however, that other low-k materials may be used such as the materials indicated above.

In operation, the substrate 301 including the etch stop layer 302 is loaded onto the substrate holder 202 by suitable means (not shown). Then, the ambient within the process chamber 201 is stabilized and prepared for the deposition of the first dielectric layer 303 from precursors. The hydrogen-containing silicon-oxy-carbide is deposited with oxygen ($O_2$) and trimethylsilane (3MS), wherein, according to one illustrative embodiment, a plasma ambient is generated comprising an inert gas, such as helium, and the precursor gases oxygen ($O_2$) and trimethylsilane (3MS). A typical pressure range is approximately 4–6 Torr at a temperature of about 300–400° C. Depending on the exact process parameters, a time of approximately 15–20 seconds is typically required to deposit the first dielectric layer with a thickness of approximately 250 nm, with a high frequency power in the range of about 500–900 W. The flow rates for helium, oxygen and 3MS may be adjusted to approximately 300–500 sccm, 300–500 sccm and 1000–1800 sccm, respectively.

After the formation of the first dielectric layer 303, the etch indicator layer 320 is formed in the same process chamber 201 or in a different deposition tool that may comprise the same elements as the tool 200.

According to one illustrative embodiment, the etch indicator layer 320 is formed substantially as a silicon dioxide layer in a separate process chamber, wherein TEOS is used as a precursor gas. To this end, oxygen and TEOS may be introduced into the process chamber (for convenience, it will be referred to as the deposition tool 200, wherein it should be borne in mind that a deposition tool other than the tool used for depositing the first dielectric layer 303 is to be used, or a sufficiently long transition period requiring an intensive purging and stabilizing of the process chamber 201 may be required) and a plasma is created by applying high frequency power to the process chamber 201 to initiate deposition of silicon dioxide on the first dielectric layer 303. For a temperature applied to the substrate 301 of approximately 350–450° C., a pressure in the range of approximately 6–8 Torr and flow rates of approximately 400–600 sccm, 4100–4500 sccm and 4100–4500 sccm for TEOS, oxygen and helium, respectively, the thickness 308 is in the range of about 10–40 nm for a deposition time of approximately 5–7 seconds. It should be appreciated, however, that the above-identified process parameters may be changed in accordance with process requirements as long as the required thickness 308 is obtained.

In a further illustrative embodiment, the etch indicator layer 320 is formed substantially as a silicon dioxide layer by using silane (SiH$_4$) as a precursor gas. According to this embodiment, the substrate 301 including the etch stop layer 302 and the first dielectric layer 303 is inserted into an appropriate deposition tool, such as the tool 200, and silicon dioxide is deposited in a plasma-enhanced deposition cycle with silane and nitrogen oxide (N$_2$O) as reactive gases. To deposit a silicon dioxide layer with a thickness of approximately 10–40 nm, the parameter setting may be selected as follows. The temperature is in the range of approximately 350–450° C., the chamber pressure is the range of about 2–5 Torr, and the flow rates of silane and N$_2$O are in the range of approximately 80–120 sccm and 3800–4200 sccm, respectively, wherein a deposition time is in the range of about 3–5 seconds. It should be noted that the process parameters may be varied in accordance with process requirements as long as the required and specified thickness 308 is obtained.

In other embodiments, the etch indicator layer 320 may be formed on the first dielectric layer 303 in the same process chamber 201 as used for forming the first dielectric layer 303 without breaking the vacuum, that is the etch indicator layer 320 may be formed in situ. In one particular embodiment, after the formation of the first dielectric layer 303 in a manner as previously described, a transition step is carried out to stabilize the atmosphere within the process chamber 201. For example, a pump step may be carried out after completion of the deposition of the first dielectric layer 303 and, thereafter, nitrogen oxide (N$_2$O) gas is introduced into the process chamber, wherein a pressure in the range of approximately 2–4 Torr is established. Then, silane is introduced into the process chamber and the temperature is selected in a range of 380–420° C. After providing high frequency power to initiate a plasma ambient, silicon dioxide is deposited and a thickness of approximately 10–40 nm is obtained with a deposition time of approximately 3–5 seconds. Subsequently, residual gases and byproducts may be substantially removed by a pump step, and the process chamber 201 is prepared for the deposition of the second dielectric layer 305. To this end, similar process parameters may be selected as previously described with reference to the deposition of the first dielectric layer 303 and, thus, the second dielectric layer 305 is deposited having substantially equal properties as the first dielectric layer 303. Regarding the process parameters for depositing the second dielectric layer 305, the same criteria as pointed out above with reference to the first dielectric layer 303 also apply in this case.

In a further illustrative embodiment, the etch indicator layer 320 is formed substantially as a silicon dioxide layer within the same process chamber 201 as used for the formation of the first dielectric layer 303, wherein the silicon dioxide is deposited on the basis of 3MS and oxygen immediately after completion of the deposition of the first dielectric layer 303. In order to discontinue the deposition of SiCOH and to start deposition of silicon dioxide, the supply of the inert gas, such as helium, is discontinued and the flow rate of oxygen is raised to a range of approximately 800–1000 sccm. Simultaneously, the flow rate of 3MS is lowered to a range of approximately 200–300 sccm. Maintaining the parameter setting for approximately 8–12 seconds results in a thickness of approximately 10–40 nm. Subsequently, a plurality of so-called ramp-up steps may be carried out to gradually increase the helium flow rate and the 3MS flow rate, while decreasing the oxygen flow rate. Preferably, in a first ramp-up step, the oxygen flow rate is lowered to a value that has previously been used for the deposition for the first dielectric layer 303. After process conditions are established similar to those used for the deposition of the first dielectric layer 303, the second dielectric layer 305 may be deposited. It should be noted that, depending on the specific design of the ramp-up steps between the deposition of the etch indicator layer 320 and the second dielectric layer 305, a gradual deposition from silicon dioxide to hydrogen-containing silicon-oxy-carbide may take place, so that an interface between these two layers may represent a relatively gradual transition. As will be appreciated, however, by varying the above-described parameter ranges, the thickness 308, as well as the transition characteristics between the etch indicator layer 320 and the second dielectric layer 305, may be adjusted in accordance with design requirements. Moreover, a corresponding argument also applies to an interface between the first dielectric layer 303 and the etch indicator layer 320.

Since forming the first and second dielectric layers 303 and 305 and the etch indicator layer 320 requires no additional purging steps, as the same precursor gases are used, a time-efficient deposition sequence is obtained.

In a further illustrative embodiment, the substrate 301 is subjected to an oxygen treatment immediately after completion of the deposition of the first dielectric layer 303. The helium flow and the 3MS flow are discontinued and the high frequency power is reduced while the oxygen flow is maintained. With a treatment time in the range of 8–12 seconds, possibly applying a bias power in addition to the high frequency power, such as a low frequency power in the range of approximately 10 watts, silicon dioxide is formed on the first dielectric layer 303 with a thickness in the range of approximately 10–40 nm. Subsequently, a plurality of ramp-up steps is carried out to gradually re-establish process conditions similar to those described for the deposition of the first dielectric layer 303. As soon as these conditions are established, the second dielectric layer 305 may be deposited.

It should be noted that, especially in the illustrative embodiments referring to an in situ formation of the etch indicator layer 320, the composition, and thus the physical properties, of the etch indicator layer 320 depend on the precise parameter settings used for the deposition sequence. Thus a certain amount of hydrogen-containing silicon-oxy-carbide or other byproducts may be present in the etch indicator layer 320 wherein, however, the essential amount is comprised of silicon dioxide. Moreover, as already pointed out above, the transitions between a substantially silicon dioxide based region of the etch indicator layer 320 to the first and/or second dielectric layers 303 and 305 may contain a gradual transition with a varying ratio of silicon dioxide to hydrogen-containing silicon-oxy-carbide, wherein a thickness of a corresponding transition area may vary in accordance with the respective selected parameter settings. Consequently, if it is referred to as an etch indicator layer 320 comprising silicon dioxide in the specification and the appended claims, this layer is meant to describe a silicon dioxide type layer in the above-defined manner.

In other embodiments, the first and/or the second dielectric layers 303, 305 may be formed by spinning a low-k material on the substrate. To this end, one or more of the above-identified low-k materials may be used and applied by well-known spin-on techniques.

As a result, the illustrative embodiments described above allow, on the one hand, the formation of the etch indicator layer 320 substantially comprised of silicon dioxide, by separately depositing the etch indicator layer 320 on the basis of a TEOS deposition and on the basis of a silane oxide deposition. Therefore, the etch indicator layer 320 may exhibit a relatively sharply defined thickness 308 with a well-defined interface to the first and the second dielectric layers 303, 305. These ex situ deposition techniques also allow a process sequence for applying low-k materials requiring a "spin-on" coating technique.

On the other hand, the etch indicator layer 320 may be formed as an in situ process allowing the formation of the first and second dielectric layers 303, 305 and of the etch indicator layer 320 in a single deposition chamber without breaking the vacuum on the basis of a silane oxide deposition, a 3MS oxide formation and an oxidation in an oxygen atmosphere. Thus, these in situ embodiments provide maximum deposition tool utilization.

It should be appreciated that in the illustrative embodiments described above a plurality of stabilization, purge, ramp-up steps and the like may be introduced corresponding to the specific process tool used. It is thus within the scope of the present invention to adapt the above parameter values including additional steps to a corresponding deposition tool.

With reference to FIGS. 4 and 5a–5c, further embodiments of the invention will be described, wherein a trench is formed within a low-k dielectric layer stack comprising, for example, the etch stop layer 302, the first and second dielectric layer 303, 305 and the etch indicator layer 320.

Figure 4:
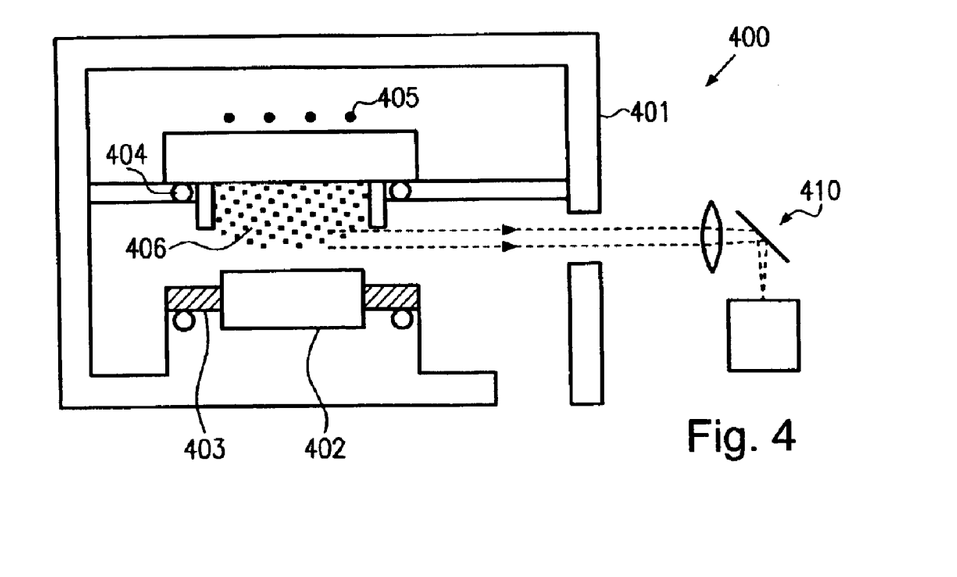
FIG. 4 schematically shows a plasma etch tool including an optical detection system that is appropriate for forming vias and trenches of a dual damascene structure in accordance with illustrative embodiments of the present invention.

FIG. 4 diagrammatically shows an etch tool 400 including a process chamber 401, a substrate holder 402, a heating means 403, a magnet assembly 404 and high frequency coils 405 to establish a plasma ambient 406 over the substrate holder 402. Moreover, the etch tool 400 comprises an optical detection system 410 to receive and detect optical radiation generated within the plasma ambient 406. The radiation created during operation of the etch tool 400 depends on the type of ions, atoms and/or molecules that are present within the plasma ambient and, therefore, by selecting an appropriate wavelength or an appropriate wavelength range, the radiation of ions, atoms and molecules of interest may be monitored.

The operation of the etch tool 400 will now be described with reference to FIGS. 3 and 5a–5c. A substrate, such as the semiconductor structure 300 as shown in FIG. 3, is loaded onto the substrate holder 402 and process parameter values, such as the type of reactive gases supplied to the process chamber 401, a pressure established in the vicinity of the substrate holder 402, a high frequency power supplied to the means 405 to establish the plasma ambient 406, the temperature of the substrate holder 402 and the like, are selected in accordance with process requirements. Since etching of a low-k material such as hydrogen-containing silicon-oxy-carbide is well known in the art, a corresponding description of the parameter settings is omitted.

Figure 5A:
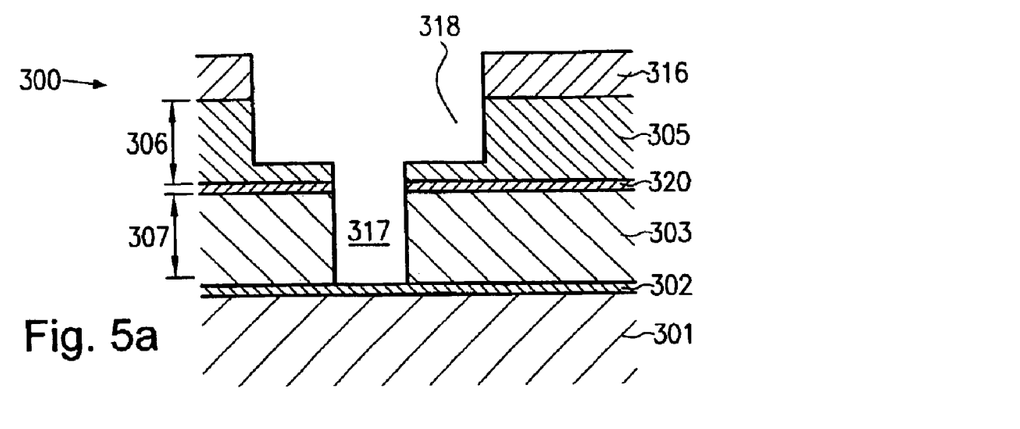
FIGS. 5a–5b schematically depict cross-sectional views of a dual damascene structure during etching a trench into the structure according to one embodiment of the present invention.

FIG. 5a shows the semiconductor structure 300 after etching a via 317 through the first and second dielectric layers 303, 305 and during the etch process for forming a trench 318 in the second dielectric layer 305. To this end, a photoresist mask 316 is provided over the second dielectric layer 305, wherein, as previously noted with reference to FIGS. 1a–1d, an anti-reflective coating may be provided on the second dielectric layer 305 depending on the photolithography technique used. FIG. 5a shows the semiconductor structure 300 at a time point in which the etch process has not yet reached the design depth of the trench 318, represented by the second thickness 306 of the second dielectric layer 305.

Figure 5B:
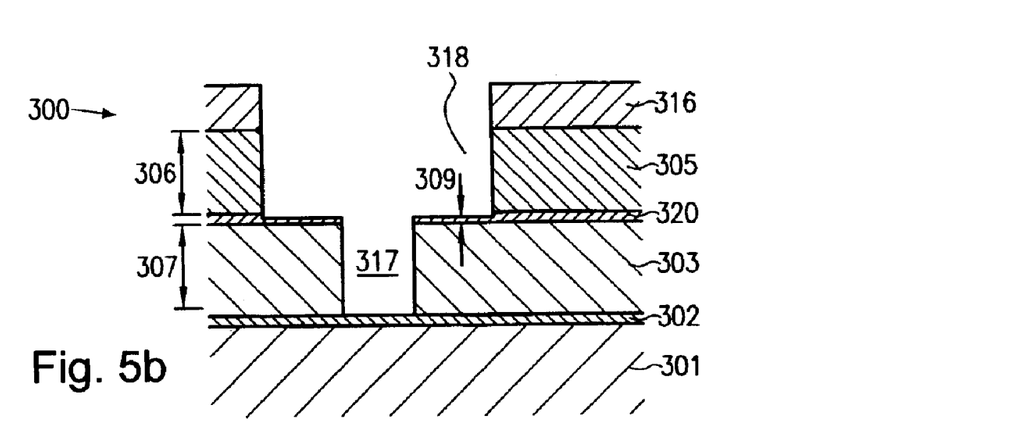

FIG. 5b shows the semiconductor structure 300 at the time when the etch process has reached the etch indicator layer 320 and thus the etch process has to be stopped. Since the etch indicator layer 320 has a different composition, for example, the etch indicator layer 320 is substantially comprised of silicon dioxide, the byproducts generated by the etch process that are then present in the plasma ambient 406 may be observed by the optical detection system 401. It has been found that, in particular, the observation of wavelength associated with excited cyanide (CN) molecules and excited carbon monoxide (CO) molecules may be used as a reliable indicator that material from the etch indicator layer 320 is removed.

Figure 5C:
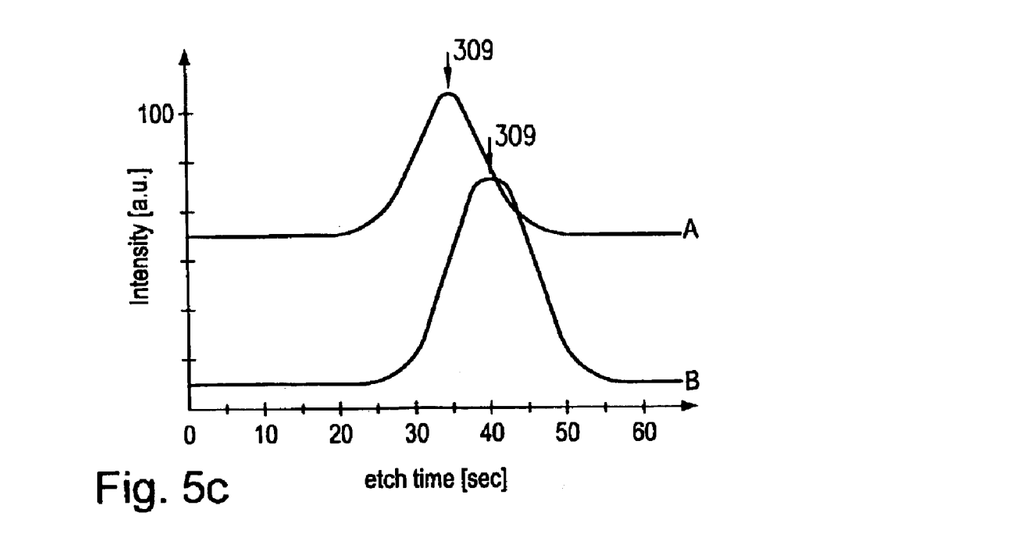
FIG. 5c is a diagram representing optical emission spectra obtained by means of the etch indicator layer during etching trenches of a dual damascene structure in accordance with the present invention.

FIG. 5c schematically depicts a representative graph illustrating smoothed and averaged intensities of optical emission spectra received by the optical detection system 401 when adjusted to wavelength emitted by cyanide (CN) molecules, represented by a curve A, and by carbon monoxide (CO) molecules, represented by a curve B. The X-axis represents the etch time in seconds, wherein it should be borne in mind that the etch time depends on the parameter settings selected for operating the etch tool 400. The Y-axis represents the intensity of the respective optical emission spectra, wherein, for convenience, arbitrary units are used. As is evident from FIG. 5c, when material is removed from the etch indicator layer 320, an increase of the corresponding intensities is observed. The slope of the curves A and B depends upon, among other things, the characteristics of the interface between the second dielectric layer 305 and the etch indicator layer 320. That is, as previously pointed out, depending on the formation process used, a more or less continuous transition from hydrogen-containing silicon-oxy-carbide to, for example, silicon dioxide leads to a corresponding increase of cyanide (CN) and carbon monoxide (CO) molecules in the plasma ambient 406 and leads to a corresponding slope of the curves A and B. As is shown in FIG. 5b, the etch process has substantially removed one half of the etch indicator layer 320 and the remaining half is indicated by 309, and the maximum of the curves A and B substantially corresponds to the removed thickness 309. The falling edge of the curves A and B would result if the etch process would be continued until the residual half of the etch indicator layer 320 is substantially completely removed. This situation may be observed, for example, in etching the via 317. As is evident from FIG. 5c, a certain amount of "delay" between curve A and curve B is observed, which is believed to be caused by a different dynamic behavior of the cyanide (CN) molecules and the carbon monoxide (CO) molecules upon etching the etch indicator layer 320. The difference of the maximum of both curves is reproducible in the range of approximately 2–5 seconds for typical etch process parameter settings and thus both curves, either individually or in combination, may be used to reliably determine the end of the etch process. For example, the etch process may be terminated at a time between the maximum of curve A and the maximum of curve B. In other examples, the maximum of the curves A or B may be considered as end point of the etch process. However, any other appropriate relationship of the curves A and B with the etch process may be established, for example, by performing one or more test runs so as to determine the removed thickness of the etch indicator layer 320 in comparison to the signal intensity.

As a result, the present invention provides reliable control of the etch process for etching the trench 318 so that a depth, and therefore the electrical characteristics of a corresponding copper line, may be adjusted within tightly set tolerances, thereby reducing resistance variations of the corresponding copper lines.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a metallization structure of a semiconductor device, the method comprising:
   providing a substrate having formed thereabove a low-k dielectric layer stack including a barrier layer, a first and a second dielectric layer and a deposited silicon oxide based etch indicator layer disposed between said first and second dielectric layers;
   forming a via in said dielectric layer stack;
   etching a trench around said via while observing an optical emission spectrum of at least one of a cyanide (CN) and a carbon monoxide (GO) compound emitted as a result of at least partially etching said deposited silicon oxide based etch indicator layer; and
   discontinuing said etching on the basis of information extracted from said optical emission spectrum.

2. The method of claim 1, wherein said at least one of said first and second dielectric layers comprise at least one of hydrogen-containing silicon-oxy-carbide (SiCOH), porous hydrogen-containing silicon-oxy-carbide (SiCOH), SiLK, porous SiLK, MSQ and HSQ.

3. The method of claim 1, wherein a thickness of said etch indicator layer is in the range of approximately 5–40 nm.

4. The method of claim 1, wherein said first dielectric layer, said deposited silicon oxide based etch indicator layer and said second dielectric layer are formed in situ in a single deposition chamber.

5. A method, comprising:
   providing a substrate having formed thereabove a barrier layer;
   forming a first dielectric layer with a first thickness;
   depositing a silicon oxide based etch indicator layer on said first dielectric layer;
   forming a second dielectric layer on said deposited silicon oxide based etch indicator layer;
   performing at least one etching process to form an opening in said second dielectric layer; and
   stopping said at least one etching process based upon optically detecting byproducts from etching at least a portion of said deposited silicon oxide based etch indicator layer.

6. The method of claim 5, wherein depositing said silicon oxide based etch indicator layer includes depositing silicon dioxide in a TEOS containing atmosphere.

7. The method of claim 5, wherein depositing said silicon oxide based etch indicator layer includes depositing silicon dioxide in a silane and a nitrogen oxide containing atmosphere.

8. The method of claim 5, wherein depositing said silicon oxide based etch indicator layer includes depositing silicon dioxide in a silane and oxygen containing atmosphere.

9. The method of claim 5, wherein said first dielectric layer is formed by a deposition process and wherein said first dielectric layer and said silicon oxide based etch indicator layer are formed in situ in a single deposition chamber.

10. The method of claim 5, wherein forming said first dielectric layer includes exposing said substrate to an oxygen and trimethylsilane containing atmosphere to deposit hydrogen-containing silicon-oxy-carbide (SiCOH).

11. The method of claim 10, wherein a plasma is excited in said oxygen and trimethylsilane containing atmosphere.

12. The method of claim 7, wherein said first dielectric layer is formed in a sub-atmospheric pressure atmosphere and said silicon oxide based etch indicator layer is formed while substantially maintaining said sub-atmospheric pressure atmosphere.

13. The method of claim 8, wherein said first dielectric layer is formed in a sub-atmospheric pressure atmosphere and said silicon oxide based etch indicator layer is formed while substantially maintaining said sub-atmospheric pressure atmosphere.

14. The method of claim 9, wherein said first dielectric layer is formed in a sub-atmospheric pressure atmosphere and said silicon oxide based etch indicator layer is formed while substantially maintaining said sub-atmospheric pressure atmosphere.

15. The method of claim 5, wherein said first and second dielectric layers are formed by plasma-enhanced chemical vapor deposition.

16. The method of claim 5, wherein said silicon oxide based etch indicator layer is formed by plasma-enhanced chemical vapor deposition.

17. The method of claim 5, wherein at least one of said first and second dielectric layers are formed by a spin-on process.

18. A method of forming a low-k dielectric layer stack, the method comprising:
   providing a substrate having formed thereabove a barrier layer;
   forming a first layer of hydrogen-containing silicon-oxy-carbide (SiCOH) with a first thickness;

depositing a silicon oxide based etch indicator layer on said first layer;

forming a second layer of hydrogen-containing silicon-oxy-carbide (SiCOH) on said deposited etch indicator layer;

performing at least one etching process to form an opening in said second dielectric layer; and stopping said at least one etching process based upon optically detecting byproducts from etching at least a portion of said deposited silicon oxide based etch indicator layer.

19. The method of claim 18, wherein said first layer of hydrogen-containing silicon-oxy-carbide (SiCOH), said deposited silicon oxide based etch indicator layer and said second layer of hydrogen-containing silicon-oxy-carbide (SiCOH) are formed by performing at least one deposition process in situ in a single deposition chamber.

20. The method of claim 18, wherein depositing said silicon oxide based etch indicator layer includes depositing silicon dioxide in a TEOS containing atmosphere.

21. The method of claim 18, wherein depositing said silicon oxide based etch indicator layer includes depositing silicon dioxide in a silane and a nitrogen oxide containing atmosphere.

22. The method of claim 18, wherein depositing said silicon oxide based etch indicator layer includes depositing silicon dioxide in a silane and oxygen containing atmosphere.

23. The method of claim 21, wherein said first layer of hydrogen-containing silicon-oxy-carbide (SiCOH) is formed in a sub-atmospheric pressure atmosphere and said silicon oxide based etch indicator layer is formed by performing a deposition process while substantially maintaining said sub-atmospheric pressure atmosphere.

24. The method of claim 22, wherein said first layer of hydrogen-containing silicon-oxy-carbide (SiCOH) is formed in a sub-atmospheric pressure atmosphere and said silicon oxide based etch indicator layer is formed by performing a deposition process while substantially maintaining said sub-atmospheric pressure atmosphere.

25. The method of claim 18, wherein said first layer of hydrogen-containing silicon-oxy-carbide (SiCOH) is formed in a sub-atmospheric pressure atmosphere and said silicon oxide based etch indicator layer is formed by performing a deposition process while substantially maintaining said sub-atmospheric pressure atmosphere.

26. The method of claim 18, wherein said first and second layers of hydrogen-containing silicon-oxy-carbide (SiCOH) are formed by plasma-enhanced chemical vapor deposition.

27. A method of forming a metallization structure of a semiconductor device, the method comprising:

providing a substrate having formed thereabove a low-k dielectric layer stack including a barrier layer, a first and a second layer of hydrogen-containing silicon-oxy-carbide (SiCOH) and a deposited silicon oxide based etch indicator layer disposed between said first and second layers;

forming a via in said dielectric layer stack;

etching a trench around said via while observing an optical emission spectrum of at least one of a cyanide (CN) and a carbon monoxide (CO) compound emitted as a result of at least partially etching said deposited silicon oxide based etch indicator layer; and discontinuing said etching on the basis of information extracted from said optical emission spectrum.

28. The method of claim 27, wherein said first and second layers of hydrogen-containing silicon-oxy-carbide (SiCOH) and said silicon oxide based etch indicator layer are formed by performing at least one deposition process in situ in a single deposition chamber.

29. The method of claim 27, wherein a thickness of said etch indicator layer is in the range of approximately 5–40 nm.

* * * * *

UNITED STATES PATENT AND TRADEMARK OFFICE
CERTIFICATE OF CORRECTION

PATENT NO. : 6,927,161 B2  Page 1 of 1
DATED : August 9, 2005
INVENTOR(S) : Hartmut Ruelke et al.

It is certified that error appears in the above-identified patent and that said Letters Patent is hereby corrected as shown below:

Column 11,
Line 54, change "(GO)" to -- (CO) --.

Signed and Sealed this

Twenty-seventh Day of September, 2005

JON W. DUDAS
*Director of the United States Patent and Trademark Office*